(12) United States Patent
Haro et al.

(10) Patent No.: US 7,597,574 B2
(45) Date of Patent: Oct. 6, 2009

(54) LAMP FASTENERS FOR SEMICONDUCTOR PROCESSING REACTORS

(75) Inventors: Robert C. Haro, Gilbert, AZ (US); Ellis G. Harvey, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 6 days.

(21) Appl. No.: 11/502,935

(22) Filed: Aug. 11, 2006

(65) Prior Publication Data

US 2008/0038950 A1   Feb. 14, 2008

(51) Int. Cl.
*H01R 27/00*   (2006.01)
(52) U.S. Cl. .................................................... 439/220
(58) Field of Classification Search ......... 439/352–357, 439/220; 362/216, 246
See application file for complete search history.

(56) References Cited

U.S. PATENT DOCUMENTS

| | | | |
|---|---|---|---|
| 2,056,628 A * | 10/1936 | St Louis ........................ 313/33 |
| 2,151,807 A | 3/1939 | Graff-Baker |
| 2,387,055 A * | 10/1945 | Bryant ..................... 200/6 BB |
| 2,454,243 A * | 11/1948 | Wiedenhoeft ................ 362/216 |
| 2,706,804 A | 4/1955 | Ziebell |
| 3,376,779 A | 4/1968 | Sol |
| 3,505,636 A | 4/1970 | McDowell |
| 3,862,397 A * | 1/1975 | Anderson et al. ............ 219/405 |
| 4,049,335 A | 9/1977 | Julian et al. |
| 4,261,402 A | 4/1981 | Stanaitis |
| 4,632,497 A | 12/1986 | Boysen |
| 4,692,343 A * | 9/1987 | Price et al. ................... 427/574 |
| 5,289,353 A | 2/1994 | Sasajima et al. |
| 5,372,781 A * | 12/1994 | Hallett et al. ............. 422/186.3 |
| 5,511,301 A | 4/1996 | McGuire |
| 5,624,287 A | 4/1997 | Newman et al. |
| 5,683,196 A * | 11/1997 | Toyoda et al. ................ 403/131 |
| 5,781,692 A | 7/1998 | Wagner |
| 5,842,894 A | 12/1998 | Mehlberg |
| 5,997,341 A | 12/1999 | Ushiyama et al. |
| 6,280,263 B1 | 8/2001 | Manor et al. |
| 6,398,595 B2 | 6/2002 | Wakata et al. |
| 6,518,547 B2 | 2/2003 | Takahashi et al. |
| 6,648,692 B1 | 11/2003 | Gillrath et al. |

(Continued)

FOREIGN PATENT DOCUMENTS

DE    2034680    4/1971

OTHER PUBLICATIONS

Partial European Search Report dated Mar. 10, 2008.

(Continued)

*Primary Examiner*—Jean F Duverne
(74) *Attorney, Agent, or Firm*—Knobbe, Martens Olson & Bear LLP

(57) ABSTRACT

A heat lamp which has captured fasteners that can attach the lamp inside a radiantly heated semiconductor processing reactor. The fasteners are captured within eyelet terminals on each end of the lamp, thereby rotatably securing the fasteners to the lamp. The eyelet terminals may have threaded apertures which screw into the threaded portion of the fasteners. Alternatively, the terminals may be adapted with tabs, conductor extensions or housing assemblies which fold over the top of a fastener inserted through the terminal. In another embodiment, the terminals may be adapted with notched projections which engage a circular dovetail in a fastener inserted through the terminal.

17 Claims, 6 Drawing Sheets

U.S. PATENT DOCUMENTS

| | | |
|---|---|---|
| 6,696,672 B2 | 2/2004 | Ke et al. |
| 7,075,037 B2 | 7/2006 | Shimizu et al. |
| 2001/0027969 A1 | 10/2001 | Takahashi et al. |
| 2002/0084391 A1 | 7/2002 | Ke et al. |
| 2002/0150395 A1 | 10/2002 | Shimizu et al. |

OTHER PUBLICATIONS

Partial European Search Report dated Aug. 18, 2008.

\* cited by examiner

LAMP FASTENERS FOR SEMICONDUCTOR PROCESSING REACTORS

FIELD OF THE INVENTION

The present invention generally relates to heat lamps suitable for semiconductor processing reactors.

BACKGROUND OF THE INVENTION

Chemical vapor deposition (CVD) is a very well known process in the semiconductor industry for forming thin films of materials on substrates, such as silicon wafers. In a CVD process, gaseous molecules, including constituents of the material to be deposited, are supplied to wafers to form a thin film of that material on the wafers by chemical reaction. Typically, CVD processes are conducted at elevated temperatures to accelerate the chemical reaction and to produce high quality films.

Substrates (e.g., silicon wafers) can be heated using resistance heating, induction heating or radiant heating. Among these, radiant heating is the most efficient technique and, hence, is the currently favored method for certain types of CVD, particularly for cold wall reactors, where rapid heating is desired in each heating cycle. Similarly, radiant heating is favored in numerous other types of semiconductor processing reactors, such as rapid thermal anneal (RTA), rapid thermal processors (RTP), etch tools, etc. Radiant heating involves positioning infrared lamps within high-temperature ovens, called reactors. Currently, lamps are fastened into the reactor with brass washers and screws. Because of the confined space in the reactor, these screws are difficult to install and/or replace and often are lost within the hardware of the reactor itself. Lost screws have the potential to damage the reactor or cause electrical short-circuits, and, consequently, time is sacrificed locating and replacing them during lamp changes.

Accordingly, a need exists for a means of fastening heating lamps in a semiconductor processing reactor which avoids the aforementioned problems of the prior configuration.

SUMMARY OF THE INVENTION

In one aspect of the invention, there is provided a lamp for semiconductor processing. The lamp includes a lamp body, a filament within the lamp body, a captured fastener assembly, and a conductive connector which provides electrical connection from the filament to the captured fastener.

It is contemplated that the captured fastener may take one of several forms. In a preferred embodiment, the captured fastener includes a threaded eyelet terminal. A threaded screw is threaded through the eyelet terminal. The threads in the upper portion of the screw's shank are relieved so that the screw may rotate freely once the threaded portion has passed through the threaded eyelet. In another embodiment, the conductive wire lead of the lamp is extended through the crimped portion of the eyelet such that it retains the screw in the eyelet. In another embodiment, a screw with an annular groove is inserted through an eyelet terminal. A retaining snap ring is subsequently engaged onto the annular groove. In yet another embodiment, a screw is inserted through an eyelet terminal and tabs on the top of the eyelet terminal are engaged over the head of the screw. In still another embodiment, a screw is inserted through an eyelet terminal with a housing assembly, hingedly connected to the terminal by an arm, is folded over the head of the screw. In still another embodiment, a screw with a circular dovetail in the bottom of the head is inserted through an eyelet terminal. The eyelet terminal has a notched projection extending from the top surface which engages the circular dovetail.

In accordance with another aspect of the invention, a method is provided for maintaining a screw within an eyelet terminal of a lamp for a semiconductor processing reactor. The method includes providing a screw comprising a head and an elongated shank portion, where the elongated shank portion has a threaded portion. The screw is inserted into the eyelet terminal. The screw is captured in the eyelet terminal to prevent removal of the screw from the eyelet terminal.

In accordance with another aspect of the invention, a chemical vapor deposition reactor is provided. The reactor includes a lamp, a fastener for securing the lamp inside the reactor, and means for retaining the fastener on the lamp after the lamp is removed from the reactor.

BRIEF DESCRIPTION OF THE DRAWINGS

These are other aspects of the invention will be readily apparent from the description below and the appended drawings, in which like reference numerals refer to similar parts throughout, which are meant to illustrate and not to limit the invention.

DETAILED DESCRIPTION OF THE PREFERRED EMBODIMENT

Figure 1:
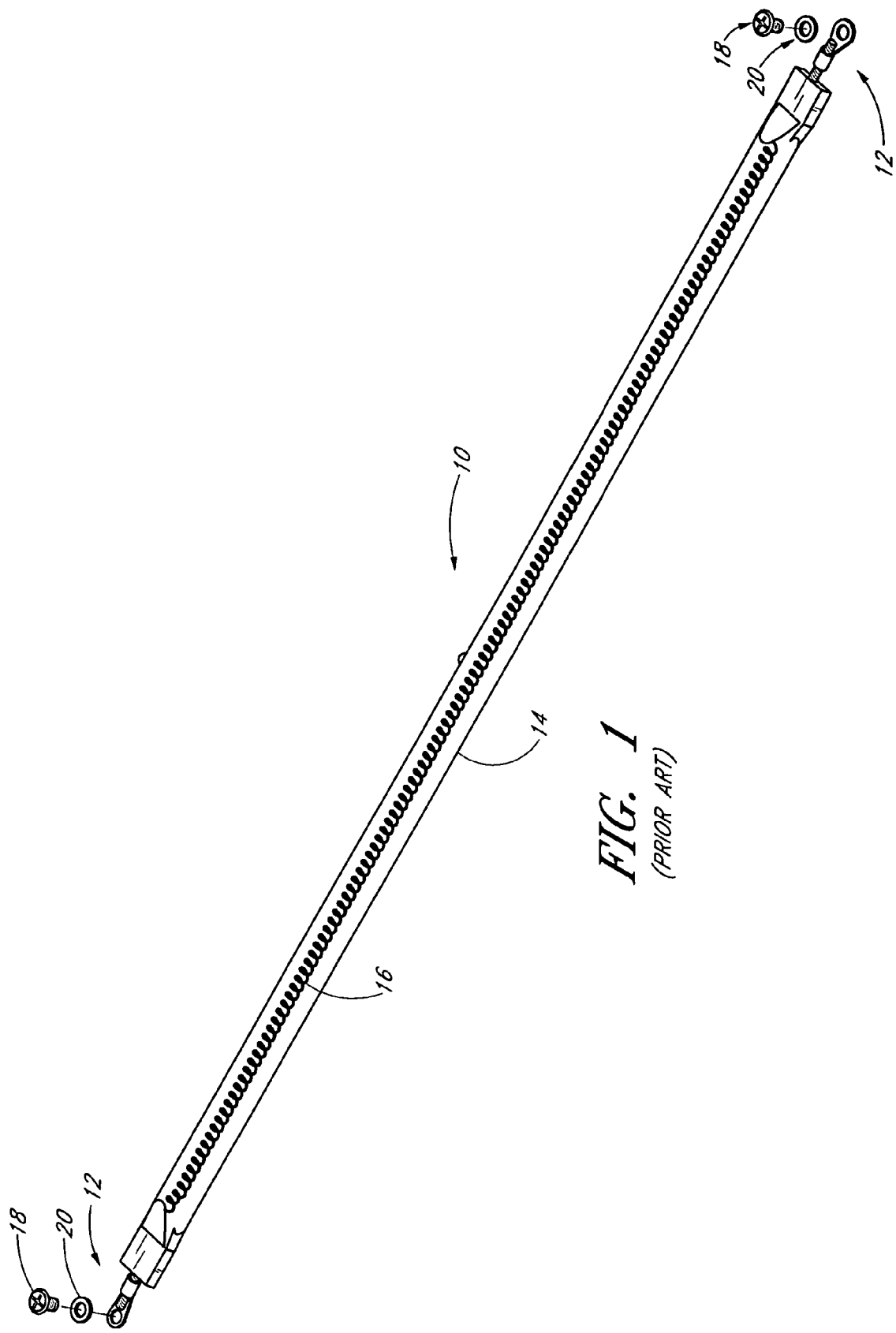
FIG. 1 is a side view of a prior art lamp with a conventional eyelet terminal which is mounted into the reactor with a screw and washer.

FIG. 1 depicts a prior art lamp 10 as might be typically found in a reactor. The illustrated lamp 10 generally comprises two eyelet terminals 12, made of a conductive metal, disposed at opposite ends of a tube 14, which is typically made of quartz or some other transparent material. A filament 16 extends though the tube 14, and is electrically connected to each of the eyelet terminals 12. Each eyelet terminal 12 is fastened to the reactor with a brass screw 18 (illustrated as a Philips head) and washer 20. Thus, when a power source is connected across the terminals 12, the filament 16 receives current and provides a source of radiant energy in a manner generally known to those of ordinary skill in the art. Unfortunately, the confined space inside the reactor makes removal and retrieval of the screw 18 and washer 20 difficult. Because these lamps are consumed in their operation, they must frequently be replaced with new lamps. This constant replacement increases the potential for the fasteners to be dropped and lost. In addition, a typical reactor contains over 20 lamps (40 eyelets and fasteners), which further increases the potential for dropped fasteners.

Figure 2A:
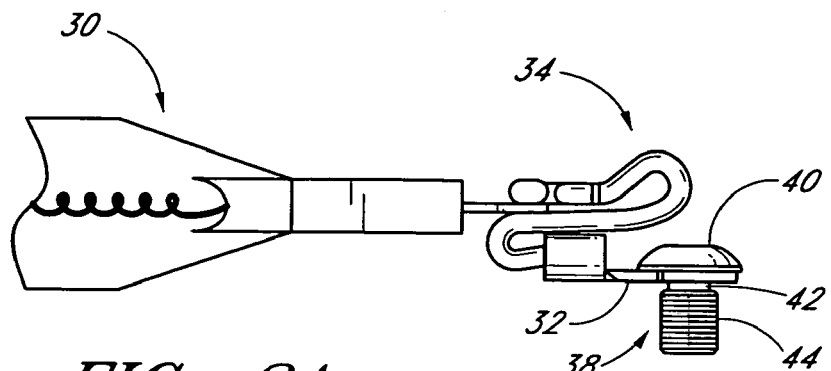
FIGS. 2A and 2B are side views of a screw captured by a threaded eyelet terminal or an extended conductor wire lead, respectively, constructed in accordance with two preferred embodiments of the present invention.
Figure 3A:
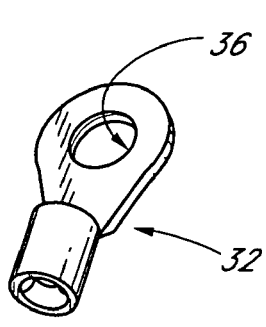
FIGS. 3A and 3B are perspective views of the eyelet terminals in FIGS. 2A and 2B, respectively.

One proposed solution to this problem is to capture the fastener with the eyelet terminal. As shown in a preferred embodiment, FIGS. 2A and 3A, a quartz lamp 30 is attached to an eyelet terminal 32 by a wire or conductive connector 34. An aperture 36 of the eyelet terminal 32 is internally threaded. In this preferred embodiment, a fastener or screw 38 can be tightened with an alien wrench, such that a hexagonal socket is provided in the button head 40. Of course, alternative drive mechanisms could be used; therefore, any type of screw or bolt could be substituted. An elongated shank portion extends from the button head 40. The shank has an undercut unthreaded cylindrical middle portion 42 and a threaded end portion 44 terminating in a blunt tip. The captured screw is assembled by threading the screw 38 through the threaded eyelet 32. After assembly, the unthreaded middle portion 42 freely rotates within the eyelet 36 but the screw 38 is unable to escape the threaded eyelet 32 without deliberate unscrewing. In installing the lamp 30 into the reactor, the threaded end portion 44 can be screwed into the reactor electrodes while the unthreaded middle portion 42 freely rotates within the eyelet 36.

An exemplary semiconductor processing reactor, in which lamps in accordance with FIG. 1 and in accordance with the embodiments of FIGS. 2A-15 are employed, is the Epsilon® chemical vapor deposition reactor, commercially available from ASM America, Inc. of Phoenix, Ariz. A description of one configuration of a heating system for the Epsilon® chamber is in U.S. Pat. No. 4,975,561, issued Dec. 4, 1990, entitled "Heating System for Reaction Chamber of Chemical Vapor Deposition Equipment," the disclosure of which is incorporated herein by reference. For such a context, the lamps described herein preferably each have a 6 kW to 10 kW capacity.

Figure 2B:
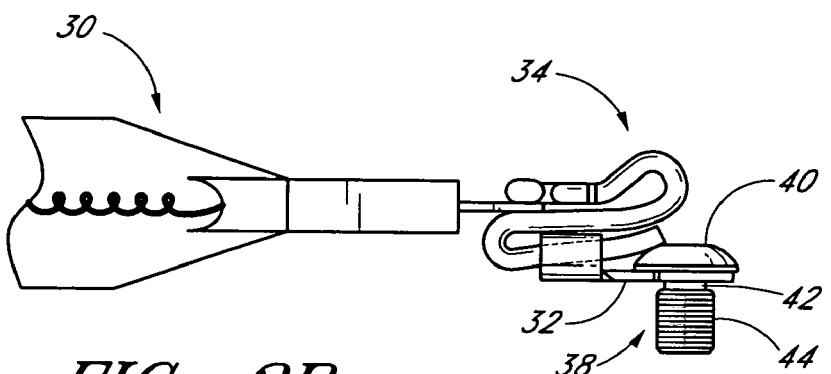
Figure 3B:
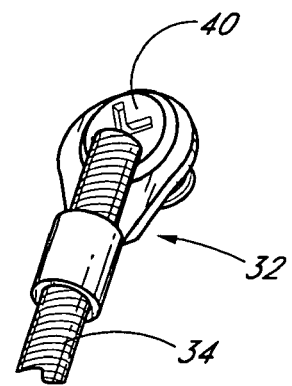

FIGS. 2B and 3B illustrate a modified embodiment, in which the conductive connector 34 includes an extended braided wire lead that aids keeping the screw 38 biased downwardly in contact with the eyelet terminal 32. The conductive connector 34 is extended through a retaining portion of the eyelet terminal 32, which is then crimped, such that the extended portion contacts and helps retain the head 40 of the screw 38. As shown, the eyelet terminal 32 of this embodiment need not have internal threads.

Figure 4:
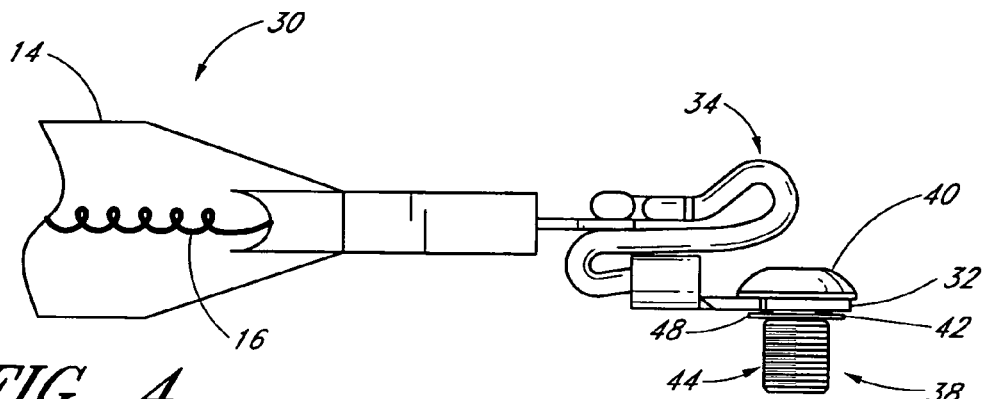
FIG. 4 is a side view of a screw captured by a retaining snap ring, constructed in accordance with another embodiment of the present invention.
Figure 5:
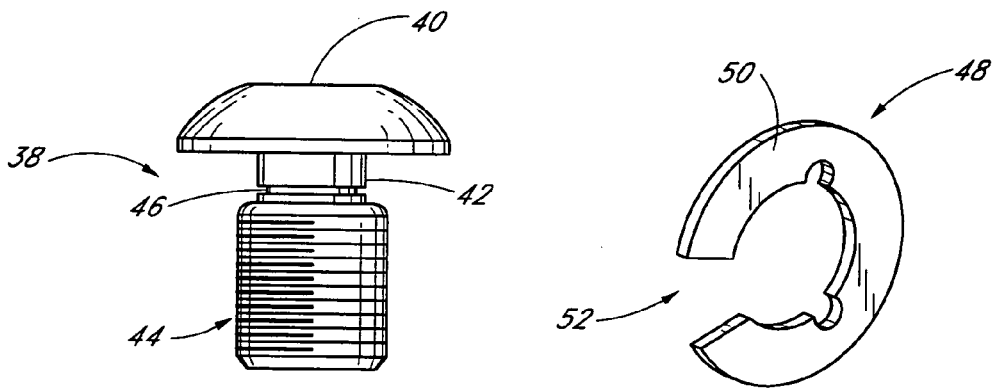
FIG. 5 is a side view of the screw and a perspective view of the retaining snap ring in FIG. 4.

FIGS. 4 and 5 show a captured fastener assembly, in accordance with another embodiment of the present invention. The fastener or screw 38 has a button head 40 and an elongated shank portion extending from the head 40. The shank has an undercut unthreaded cylindrical middle portion 42 and a threaded end portion 44 terminating in a blunt tip. An annular groove 46 (FIG. 5) is provided adjacent the proximal end of the threaded end portion 44. For retaining the screw member in a captured rotatable relationship with the eyelet, there is provided a retaining snap ring 48 (e.g., E-ring, C-ring). The retaining snap ring 48 includes an annular peripheral rim 50 with a spaced gap 52. The rim 50 provides engagement within the annular groove 46 of the screw member. The captured screw is assembled by inserting the screw 38, with or without a washer, through the eyelet terminal 32. The screw member is captured by having the rim 50 of the retaining snap ring 48 engage in the annular groove 46 of the screw 38, the ring 48 being positioned on the underside of the eyelet terminal 32.

Figure 6:
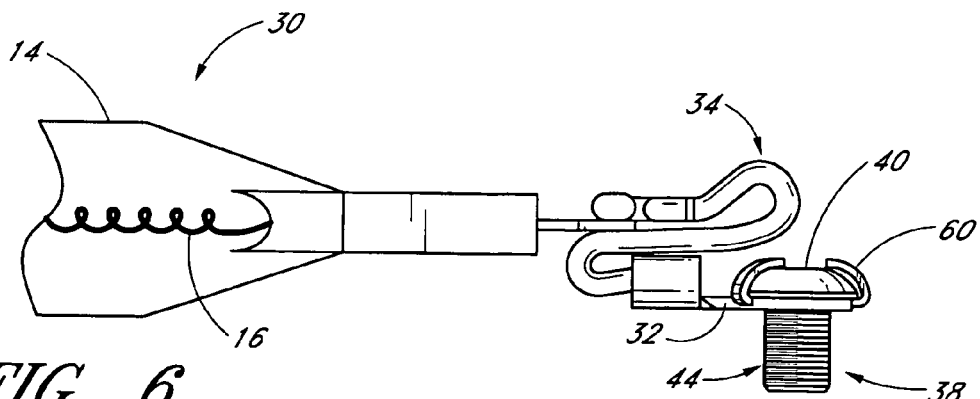
FIG. 6 is a side view of a screw captured by bendable tabs on the eyelet terminal, constructed in accordance with still another embodiment of the present invention.
Figure 7:
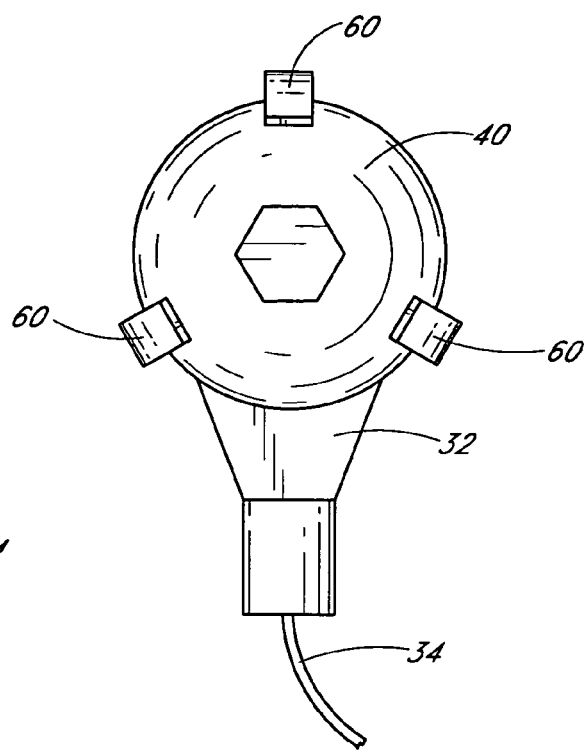
FIG. 7 is a top plan view of the screw and bendable tabs in FIG. 6.
Figure 8:
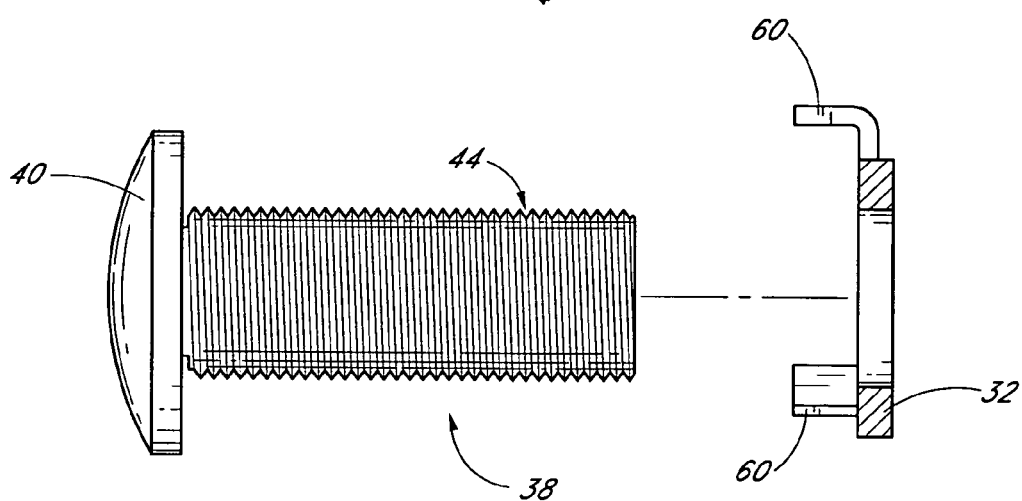
FIG. 8 is a side view of the screw and eyelet terminal in FIG. 6 before the tabs have captured the screw.
Figure 9:
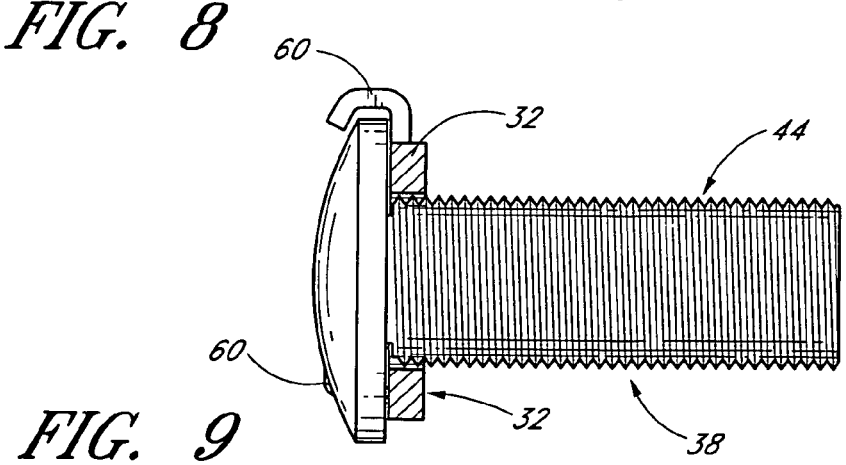
FIG. 9 is a side view of the screw and eyelet terminal in FIG. 6 after the tabs have captured the screw.
Figure 10:
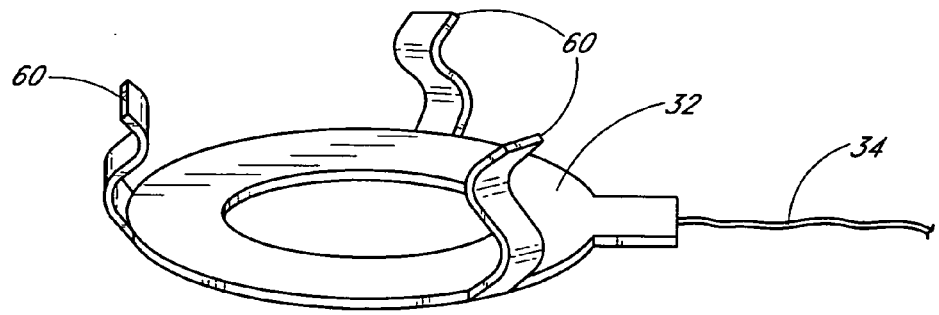
FIG. 10 is a perspective view of an alternative configuration for the embodiment shown in FIG. 6, where compliant tabs are fixed.

FIGS. 6 and 7 are a side view and top view, respectively, of a captured fastener assembly, in accordance with still another embodiment of the present invention. The quartz lamp 30 is attached to the eyelet terminal 32 by a conductive connector 34. The fastener or screw 38 has a hexagonal socket button head 40 and a threaded portion 44 terminating in a blunt tip. Because the eyelet terminal 32 is unthreaded, the screw 38 need not include any unthreaded portion. For retaining the screw 38 in a captured rotatable relationship with the eyelet terminal 32, the eyelet 32 has an integrated capture portion with three upwardly protruding rectangular tabs 60 spaced evenly around the diameter of its top surface. Instead of the illustrated three bendable tabs, one or more bendable tabs may be used. As shown in FIGS. 8-9, the captured screw is assembled by inserting the screw 38, with or without a washer, through the eyelet terminal 32. The screw 38 is captured by bending the tabs 60 over the head 40 of the screw 38. As shown in FIG. 10, instead of the illustrated bendable tab configuration, it will be understood that the tabs may be fixed with a compliant shape, for instance, sinuate, that allows the tabs 60 to snap around the screw member head 40 when engaged.

Figure 11:
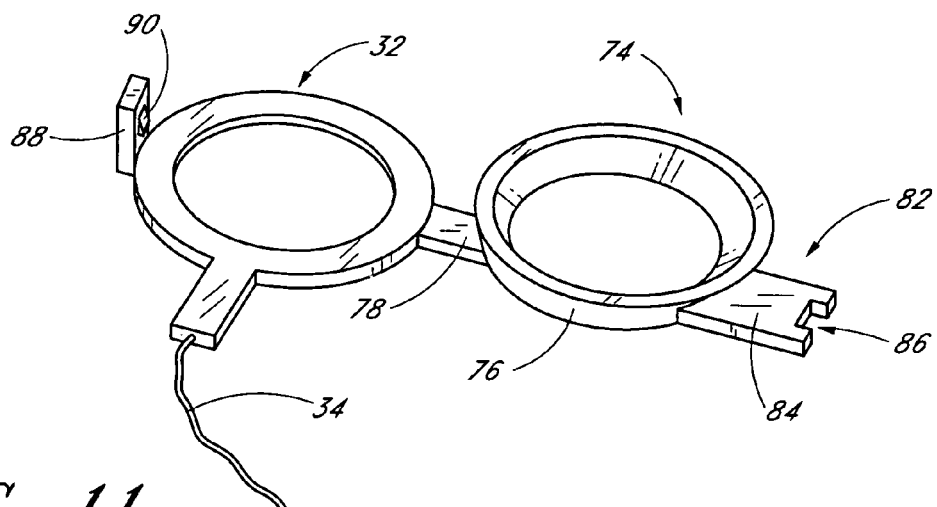
FIG. 11 is a perspective view of a housing assembly on the eyelet terminal, constructed in accordance with yet another embodiment of the present invention.
Figure 12:
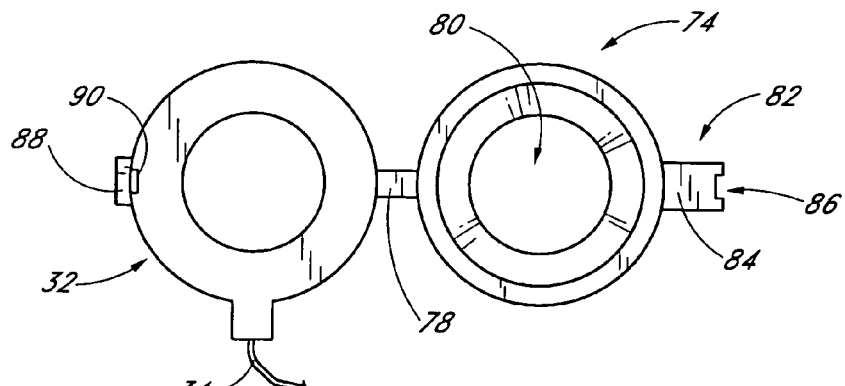
FIG. 12 is a top plan view of the eyelet terminal and housing shown in FIG. 11.

FIGS. 11 and 12 are a side view and a top down view, respectively, of a captured fastener assembly, in accordance with yet another embodiment of the present invention. For retaining a screw in a captured rotatable relationship with the eyelet terminal 32, the eyelet terminal 32 is modified by adding a housing assembly 74. The housing assembly 74 comprises a conical cap member 76 hingedly connected to the eyelet terminal 32 by an arm 78. The arm portion 78 is bendable about a radius adapted to place the housing assembly over the eyelet portion in order to capture the screw member head 40 when engaged. A through bore 80 is provided in the top of the cap for screwdriver access to the head of the screw member. The diameter of the bore 80 is selected to be large enough to permit the selected size of a tightening mechanism (not shown) to reach and manipulate the screw, but small enough to prevent lifting of the screw out of the eyelet terminal 32.

Figure 13:
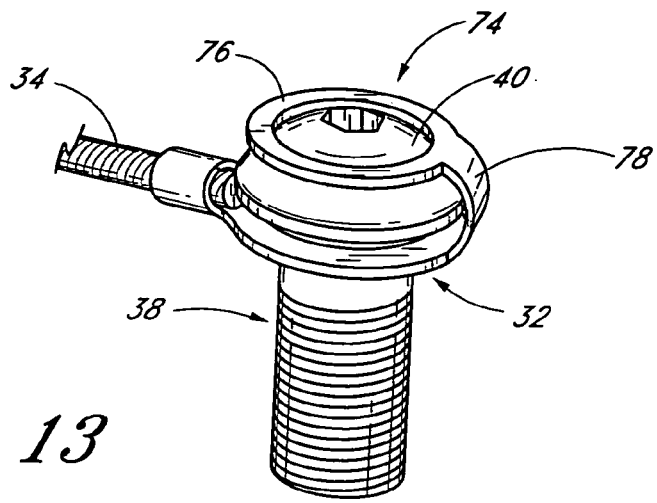
FIG. 13 is a perspective view of an alternative configuration for the embodiment shown in FIG. 11, where there is no notch and catch assembly.
Figure 14:
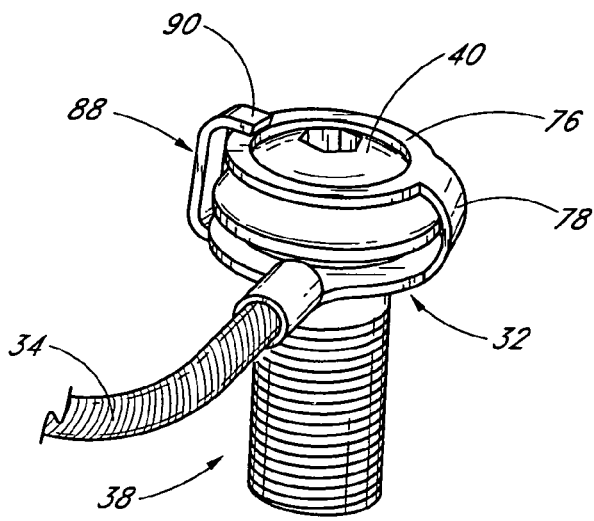
FIG. 14 is a perspective view of an alternative configuration for the embodiment shown in FIG. 11, where the catch engages directly on the housing assembly.

In the present example, a catch assembly 82 is provided on the conical cap 76 member to secure it when the cap is engaged, but as an alternative, shown in FIG. 13, the catch assembly may be omitted. Returning to FIGS. 11 and 12, the catch assembly 82 comprises a fixed rectangular tab 84 outwardly extended from the side of the conical cap member 76 and having a notch 86 at the distal end. The catch assembly 82 further comprises a tab 88 with a compliant catch 90 upwardly extending from the eyelet terminal 32. As shown in FIG. 14, note that the illustrated notch 86 may be omitted such that the catch 90 engages directly to the conical housing assembly 74.

The captured screw is assembled by inserting a screw 38 or screw and washer through the eyelet terminal 32. The screw member is captured by folding the conical cap member 76 over the head of the screw. If a catch assembly 82 is used, the notched tab 84 of the conical cap 76 engages in the compliant catch 90 of the eyelet terminal 32. In other arrangements, instead of the illustrated conical cap configuration, it will be understood that the cap may have other geometries, e.g., ring-shaped.

Figure 15:
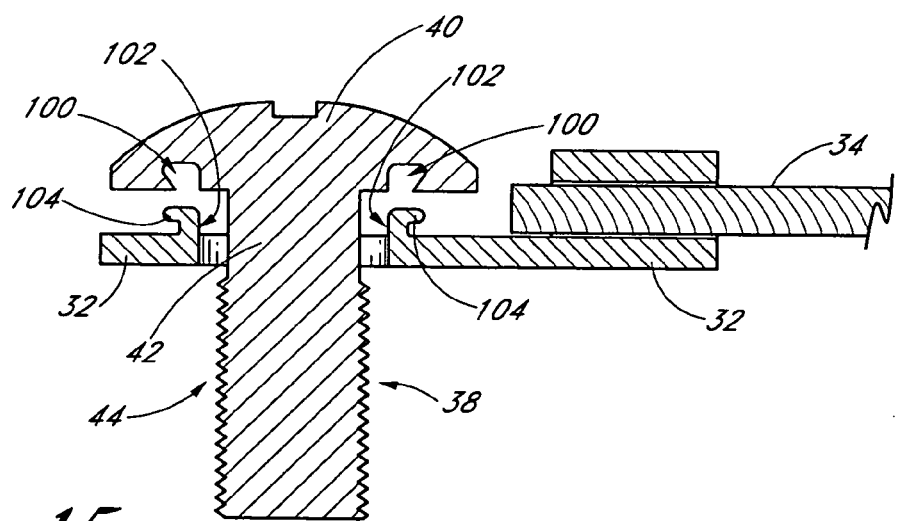
FIG. 15 is a side view of a fastener with a circular dovetail captured by a compliant tong on the eyelet terminal, constructed in accordance with still another embodiment of the present invention.

FIG. 15 is a side view of a captured fastener assembly, in yet another embodiment of the present invention. The fastener or screw 38 has a hexagonal socket button head 40 and an elongated shank portion extends from the head 40. The shank has an undercut unthreaded cylindrical middle portion 42 and a threaded end portion 44 terminating in a blunt tip. A circular dovetail 100 concentrically formed around the shank is recessed into the bottom surface of the screw head 40. Note that the inner diameter of the circular dovetail 100 is smaller than the diameter of the eyelet terminal 32, but larger than the major diameter of the shank. The eyelet terminal has a generally cylindrical collar 102 upwardly extending from the top surface. The inner diameter of the collar aligns with the inner diameter of the eyelet terminal 32. The collar 102 has a compliant notch 104 extending radially outward from the top surface. The captured screw is assembled by inserting the screw 38 through the eyelet terminal 32. The screw member 38 is captured by engaging the circular dovetail 100 of the screw member into the compliant notch 104 of the collar extension 102. In other arrangements, instead of the illustrated notched collar, it will be understood that the compliant notched engaging member could have other configurations, such as two or more notched tabs, upwardly extending from the top surface of the eyelet terminal.

In each of the foregoing embodiments, a screw is captured in an eyelet terminal in the sense that the screw cannot be vertically lifted from the eyelet without deliberate modification to release the screw. However, the screw freely rotates within the eyelet for ready attachment to a corresponding terminal or electrode within a radiantly heated semiconductor reactor.

It will be appreciated by those skilled in the art that various modifications and changes may be made without departing from the scope of the invention. Such modifications and changes are intended to fall within the scope of the invention, as defined by the appended claims.

We claim:

1. A chemical vapor deposition reactor comprising a lamp, a fastener for securing the lamp inside the reactor, and means for retaining the fastener on the lamp after the lamp is removed from the reactor, wherein the lamp comprises a lamp body and a filament within the lamp body, further comprising a conductive connector which provides electrical connection from the filament to the means for retaining the fastener.

2. The chemical vapor deposition reactor of claim 1, wherein the means for retaining the fastener comprises an eyelet portion having an aperture, wherein the fastener is inserted through the aperture.

3. The chemical vapor deposition reactor of claim 2, wherein the means for retaining the fastener further comprises a washer.

4. The chemical vapor deposition reactor of claim 2, wherein the means for retaining the fastener comprises an extension of the conductive connector projecting through a crimped portion of the eyelet portion to hold the fastener in place.

5. The chemical vapor deposition reactor of claim 2, wherein the fastener is a screw comprising a head and an elongated shank portion, the elongated shank portion having an unthreaded middle portion and a threaded end portion.

6. The chemical vapor deposition reactor of claim 5, wherein the aperture is threaded and the fastener is threaded through the threaded aperture.

7. The chemical vapor deposition reactor of claim 5, wherein a retaining ring maintained adjacent to the proximal end of the threaded end portion rotatably secures the fastener to the eyelet.

8. The chemical vapor deposition reactor of claim 2, wherein the fastener comprises a head and an elongated shank portion, the head portion having a circular dovetail in the bottom surface, and wherein the eyelet portion further comprises one or more upwardly extending, notched projections adapted to engage the circular dovetail.

9. A chemical vapor deposition reactor comprising a lamp, a fastener for securing the lamp inside the reactor, and means for retaining the fastener on the lamp after the lamp is removed from the reactor,
wherein the lamp comprises a lamp body and a filament within the lamp body, further comprising a conductive connector which provides electrical connection from the filament to the means for retaining the fastener, and
wherein the means for retaining the fastener comprises an eyelet portion having an aperture, and
wherein the fastener is inserted through the aperture, and
wherein the fastener is a screw comprising a head and an elongated shank portion, the elongated shank portion having an unthreaded middle portion and a threaded end portion, and
wherein a retaining ring maintained adjacent to the proximal end of the threaded end portion rotatably secures the fastener to the eyelet, and
wherein an annular groove is provided adjacent to the proximal end of the threaded end portion to maintain the retaining ring and the retaining ring comprises a snap ring which snaps into the annular groove.

10. The chemical vapor deposition reactor of claim 2, wherein the means for retaining the fastener further comprises a capture portion integral with the eyelet portion.

11. The chemical vapor deposition reactor of claim 10, wherein the capture portion comprises upwardly protruding tabs.

12. The chemical vapor deposition reactor of claim 11, wherein the tabs are adapted to be bent to position over the head of the fastener.

13. The chemical vapor deposition reactor of claim 11, wherein the tabs are compliant and shaped to snap around the head of the fastener.

14. A chemical vapor deposition reactor comprising a lamp, a fastener for securing the lamp inside the reactor, and means for retaining the fastener on the lamp after the lamp is removed from the reactor,
wherein the lamp comprises a lamp body and a filament within the lamp body, further comprising a conductive connector which provides electrical connection from the filament to the means for retaining the fastener, and
wherein the means for retaining the fastener comprises an eyelet portion having an aperture, and
wherein the fastener is inserted through the aperture, and
wherein the means for retaining the fastener further comprises a capture portion integral with the eyelet portion, and
wherein the capture portion comprises a housing assembly positionable over the eyelet portion, and further wherein the housing assembly comprises an arm extending from the eyelet portion, the arm having a housing portion spaced from the eyelet portion, the housing portion including an aperture, the arm portion being bendable about a radius adapted to place the housing portion over the eyelet portion.

15. The chemical vapor deposition reactor of claim 14, wherein the housing portion further comprises a notched tab extending distal from the eyelet portion, and further wherein the eyelet comprises a catch tab extending from a side of the eyelet portion distal from the housing portion and adapted to receive the catch projection.

16. The chemical vapor deposition reactor of claim 8, wherein the one or more upwardly extending, notched projections is a circular collar projection coaxial with the aperture of the eyelet portion.

17. The chemical vapor deposition reactor of claim 8, wherein the one or more upwardly extending, notched projections is a plurality of tab projections.

* * * * *

UNITED STATES PATENT AND TRADEMARK OFFICE
CERTIFICATE OF CORRECTION

PATENT NO. : 7,597,574 B2  Page 1 of 1
APPLICATION NO. : 11/502935
DATED : October 6, 2009
INVENTOR(S) : Haro et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 37 days.

Signed and Sealed this

Twenty-eighth Day of September, 2010

David J. Kappos
*Director of the United States Patent and Trademark Office*